US00RE46610E

(19) United States
(12) Reissued Patent
Nilsen et al.

(10) Patent Number: US RE46,610 E
(45) Date of Reissued Patent: Nov. 14, 2017

(54) FORMATION OF A LITHIUM COMPRISING STRUCTURE ON A SUBSTRATE BY ALD

(71) Applicant: Universitetet I Oslo, Oslo (NO)

(72) Inventors: Ola Nilsen, Oslo (NO); Helmer Fjellvåg, Oslo (NO); Mari Endresen Alnes, Oslo (NO); Titta Aaltonen, Helsinki (FI); Matti Putkonen, Espoo (FI)

(73) Assignee: Universitetet I Oslo, Oslo (NO)

(21) Appl. No.: 15/360,153

(22) Filed: Nov. 23, 2016

Related U.S. Patent Documents

Reissue of:
(64) Patent No.: 8,894,723
Issued: Nov. 25, 2014
Appl. No.: 12/810,897
PCT Filed: Dec. 23, 2008
PCT No.: PCT/NO2008/000468
§ 371 (c)(1),
(2) Date: Jan. 18, 2011
PCT Pub. No.: WO2009/084966
PCT Pub. Date: Jul. 9, 2009

(30) Foreign Application Priority Data

Dec. 28, 2007 (NO) ..... 2007 6696

(51) Int. Cl.

| | |
|---|---|
| ***C23C 16/40*** | (2006.01) |
| ***H01M 10/0562*** | (2010.01) |
| ***C23C 16/455*** | (2006.01) |
| ***H01M 6/18*** | (2006.01) |
| *H01M 6/40* | (2006.01) |

(52) U.S. Cl.
CPC ..... *H01M 10/0562* (2013.01); *C23C 16/40* (2013.01); *C23C 16/409* (2013.01); *C23C 16/45531* (2013.01); *C23C 16/45553* (2013.01); *H01M 6/185* (2013.01); *H01M 6/188* (2013.01); *H01M 6/40* (2013.01);
(Continued)

(58) Field of Classification Search
CPC ..... H01M 10/0562
USPC ..... 29/623.5
See application file for complete search history.

(56) References Cited

U.S. PATENT DOCUMENTS 6,818,517 B1 * 11/2004 Maes
2003/0052376 A1 * 3/2003 Lee et al.
(Continued)

FOREIGN PATENT DOCUMENTS

WO 0025378 * 5/2000
WO WO-00/25378 5/2000
(Continued)

OTHER PUBLICATIONS

Joshkin, V.A., et al., "Growth of Oriented Lithium Niobate on Silicon by Alternating Gas Flow Chemical Beam Epitaxy with Metalorganic Precursors," Appl. Phys. Lett., vol. 76, No. 15 (2000) pp. 2125-2127.*

*Primary Examiner* — Timothy J. Kugel
(74) *Attorney, Agent, or Firm* — Tianran Yan; Foley & Lardner LLP

(57) ABSTRACT

A method for the formation of lithium includes a layer on a substrate using an atomic layer deposition method. The method includes the sequential pulsing of a lithium precursor through a reaction chamber for deposition upon a substrate. Using further oxidizing pulses and or other metal containing precursor pulses, an electrolyte suitable for use in thin film batteries may be manufactured.

24 Claims, 2 Drawing Sheets

(52) U.S. Cl.
CPC ..... *H01M 2300/0068* (2013.01); *Y02E 60/12* (2013.01); *Y10T 29/49115* (2015.01)

(56) References Cited

U.S. PATENT DOCUMENTS

| | | | | |
|---|---|---|---|---|
| 2004/0043149 | A1 | 3/2004 | Gordon et al. | |
| 2005/0277780 | A1* | 12/2005 | Gordon et al. | C07F 9/091 556/57 |
| 2006/0141155 | A1 | 6/2006 | Gordon et al. | |
| 2007/0026309 | A1 | 2/2007 | Notten et al. | |
| 2008/0026929 | A1* | 1/2008 | Jensen et al. | B82Y 30/00 501/87 |

FOREIGN PATENT DOCUMENTS

| | | | |
|---|---|---|---|
| WO | 2006056963 | * | 6/2006 |
| WO | WO-2006/056963 | | 6/2006 |
| WO | 2006071126 | | 7/2006 |
| WO | WO-2006/071126 | | 7/2006 |
| WO | 2006092747 | | 9/2006 |
| WO | WO-2006/092747 | | 9/2006 |
| WO | 2007148983 | | 12/2007 |
| WO | WO-2007/148983 | | 12/2007 |

* cited by examiner

FORMATION OF A LITHIUM COMPRISING STRUCTURE ON A SUBSTRATE BY ALD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*RELATED APPLICATIONS*

*This application is a broadening Reissue Application of U.S. Pat. No. 8,894,723 (previously U.S. application Ser. No. 12/810,897), filed Dec. 23, 2008 as PCT/NO2008/000468, which claims priority to Norwegian Patent Application No. 20076696, filed Dec. 28, 2007, each of which is incorporated herein by reference in its entirety.*

The present invention relates to a method for formation of a lithium comprising surface layer on a substrate.

There has in later years been a large emphasis on improving methods for the formation of thin material layers on substrates of various kinds in order to produce amongst others electrolytes. It has long been a goal to produce as thin as possible, as well as defect free layers of Lithium comprising materials on a substrate in a controlled fashion. This has been of particular interest for application in battery technology. However the earlier described methods are cumbersome and expensive, and there is a great need for cheaper and better production methods. ALD (atomic layer deposition, also known as atomic layer chemical vapour deposition, ALCVD, or atomic layer epitaxy ALE) presents all the necessary properties for the formation of thin film layers upon a substrate, however it has been thought that it would not prove possible to use ALD techniques for compounds only having a single ligand such as lithium. It has been thought that single ligand compounds could not possibly be deposited using an ALD method, as the single ligand of lithium would react with the surface such that there would be no self-limiting, growth mechanism to prevent further growth according to the ALD principle. This has empirically been proven to be false as is shown in the present application that describes a method for the formation of thin film lithium-comprising layers on a substrate.

SHORT DESCRIPTION OF THE ALD METHOD

ALD also known as atomic layer chemical vapour deposition, ALCVD, or atomic layer epitaxy, ALE, is a thin-film-deposition technique that relies on alternating self-terminating gas-to-surface reactions. The film is formed by sequential pulsing of two or more reactants, using purging with inert gas between the precursor pulses to avoid gas-phase reactions. Operated under ideal conditions this process ensures saturation of all surfaces with precursor for each applied precursor pulse. The growth of the film will therefore depend on the saturation density of the involved precursor during a pulse. Unlike most other deposition and crystal growth techniques the growth is in the ideal case not dependent on the distribution of the precursors or rate of formation of growth steps on the crystallites forming the film. The growth thus follows a somewhat different type of dynamics and ensures even growth on all exposed surfaces for each pulse.

BACKGROUND ART

There are a large number of patent applications describing various aspects of thin film Li-deposition; however the majority pertain to different deposition methods such as pulsed laser deposition, sputtering, and the like. These methods present different issues to which solutions must be found, for instance laser deposition and sputtering may be harmful to the substrate due to the high energy impact of the deposited method upon the substrate. Furthermore these methods are difficult to control in an adequate manner and in such applications wherein layer thickness control is of vital importance the methods may prove difficult to apply. There is additionally the difficulty of providing a defect free or pinhole free layer which is desired in many industrial applications. Such applications may be as an electronic barrier between other materials or layers so that there is no electric leakage across the barrier or in some applications no physical contact between layers whom one desires to separate. By sputtering or by laser deposition techniques it is very difficult to ensure that the entire surface is covered and a defective film may result. An area wherein it is especially important to provide defect free layers is in battery technology wherein lithium-comprising layers are to be separated by electrolytes allowing for the passage of lithium ions, but wherein no physical or electric contact should be made between the layers to avoid an irreversible reduction in the battery efficiency. The layers should preferably be as thin as possible to provide the least resistance to the passage of the ions, and thus layer control is of the utmost importance.

P. Fragnaul et al. in J. Power Sources 54,362 1995 proposes a CVD method for the deposition of thin films of the active cathode materials $LiCoO_2$ and $LiMn_2O_4$ by chemical techniques. Low pressure chemical vapour deposition is described as being successful at readily preparing $LiCoO_2$ at temperatures ranging from 450 to 650° C.; however, in order to prepare the spinel phase $LiMn_2O_4$, temperatures greater than 600° C. were required. No mention is made of the use of ALD or ALE technology.

WO00/25378 to Menachem et al. describes a method for forming a battery in which CVD techniques are used to form an electrolyte barrier in a Li-solid state battery. However, CVD differs widely from ALD in that CVD and MOCVD are not self-limiting reactions as is ALD, and they are thus more difficult to control. There are also issues in that the reaction temperature must be very closely monitored, and in that there might occur undesirable side reactions whilst performing the deposition. In contrast ALD proposes a simple self-limiting reaction wherein a monolayer of the desired compound may be deposited on a substrate, and wherein each layer formation reaction is self controlled.

US20070026309 to Notten et al. describes a method for forming a solid battery wherein the anode and cathode are separated by an electrolyte. There is a description of the electrolyte layer being a lithium comprising electrolyte wherein said lithium comprising electrolyte is deposited by either Physical Vapor Deposition (PVD), Chemical Vapor Deposition (CVD), and/or Atomic Vapor Deposition (AVD). However there is no mention of how this is to be performed, and the sequential listing of alternative methods for the production of said electrolyte is merely a listing of known gas phase deposition methods. No mention has been found of the authors citing an ALD methodology as described in the present invention elsewhere in the art. On the contrary the authors themselves have in WO2006092747 solely proposed the use of MOCVD in the production of the Li layers, this being a clear indication that the inventors have in fact not used ALD methodology to produce the Li layers. If the authors had proposed the use of ALD in the production of Li comprising layers, they would as persons skilled in the art have recognised the beneficial aspects of the method as such, and would have proposed using ALD instead of MOCVD. EP06710932/WO2006056963 to the same authors are variations on the same theme of the above invention.

U.S. Pat. No. 6,818,517 describe the use of ALD technique to for metal oxide layer and list a considerable number of metals. There is no example which discloses how deposition of Li or La can be accomplished.

US2004/0043149 disclose the deposition of metal silicates or phosphates using CVD and ALD.

SHORT SUMMARY OF THE INVENTION

The hereinafter described invention seeks to overcome at least some of the shortcomings of the background art and comprises a method for formation of a Li-comprising layer on a substrate by atomic layer deposition comprising the following steps:

a) providing a substrate in a reaction chamber wherein said reaction chamber is arranged for gas-to-surface reactions,
b) pulsing a lithium precursor through said reaction chamber,
c) reacting said lithium precursor with at least one surface of said substrate,
d) purging of said reaction chamber
d1) by sending a purge gas through said reaction chamber for the purging of the reaction chamber or
d2) by evacuating said chamber, and
e) repeating steps b) to d) a desired number of times in order for the formation of a thin film layer of a lithium comprising material upon said at least one surface of said substrate.

Further advantageous embodiments of the invention are described in the hereinafter enclosed dependant claims.

In one embodiment of the method according to the present invention each step of the process is independently repeated a desired number of times.

In another embodiment of the method according to the present invention the steps b) through d) are repeated with independently chosen lithium precursors in step b).

In one aspect, the present invention provides a method wherein further to the described steps, a lanthanum and titanium comprising precursor is pulsed through the reaction chamber such that the reaction resulting sequence comprises:

a) providing a substrate in a reaction chamber wherein said reaction chamber is arranged for gas-to-surface reactions,
b) pulsing a lanthanum precursor through said reaction chamber,
c) reacting said lanthanum precursor with said at least one surface of said substrate,
d) purging of said reaction chamber
d1) by sending a purge gas through said reaction chamber for the purging of the reaction chamber or
d2) by evacuating said chamber,
e) pulsing an oxygen precursor through said reaction chamber,
f) reacting said oxygen precursor with said at least one surface of said substrate,
g) purging of said reaction chamber
g1) by sending a purge gas through said reaction chamber for the purging of the reaction chamber or
g2) by evacuating said chamber,
h) pulsing a lithium precursor through said reaction chamber,
i) reacting said lithium precursor with a surface layer of the substrate,
j) purging of said reaction chamber
j1) by sending a purge gas through said reaction chamber for the purging of the reaction chamber or
j2) by evacuating said chamber,
k) pulsing an oxygen precursor through said reaction chamber,
l) reacting said oxygen precursor with said at least one surface of said substrate,
m) purging of said reaction chamber
m1) by sending a purge gas through said reaction chamber for the purging of the reaction chamber or
m2) by evacuating said chamber,
n) pulsing a titanium precursor through said reaction chamber,
o) reacting said titanium precursor with said at least one surface of said substrate,
p) purging of said reaction chamber
p1) by sending a purge gas through said reaction chamber for the purging of the reaction chamber,
p2) or by evacuating said chamber,
q) pulsing an oxygen precursor through said reaction chamber,
r) reacting said oxygen precursor with said at least one surface of said substrate,
s) purging of said reaction chamber
s1) by sending a purge gas through said reaction chamber for the purging of the reaction chamber,
s2) or by evacuating said chamber,
t) repeating steps b) to s) a desired number of times in order for the formation of a thin film layer of a lithium, lanthanum and titanium comprising material upon said at least one surface of said substrate.

In one embodiment of the method according to the present invention each step of the process is independently repeated a desired number of times. In yet another embodiment is the groups of steps b) to g), h) to m) and/or n) to s) can each independently be repeated a desired number of times before continuing with the rest of the steps.

In another aspect the present invention provides a method which may result in an electrolyte comprising no or a limited number of pin holes. When applied in batteries this method will provide a lower efficiency los over time.

In yet another aspect the invention may provide improved sensor materials for sensors for measuring the concentration of alkali ions in liquids.

In another aspect the invention may provide improved $LiNbO_3$ thin films. Due to its unique electro-optical, photoelastic, piezoelectric and non-linear properties Lithium Niobate is widely used in a variety of integrated and active acousto-optical devices.

The invention may also provide improved Lithium Tantalate which exhibits unique electro-optical, pyroelectric and piezoelectric properties combined with good mechanical and chemical stability and, wide transparency range and high optical damage threshold. This makes $LiTaO_3$ well-suited for numerous applications including electro-optical modulators, pyroelectric detectors, optical waveguide and SAW substrates, piezoelectric transducers etc.

The figures are solely intended for illustration purposes and should not be construed in any manner limiting the invention:

Figure 4:
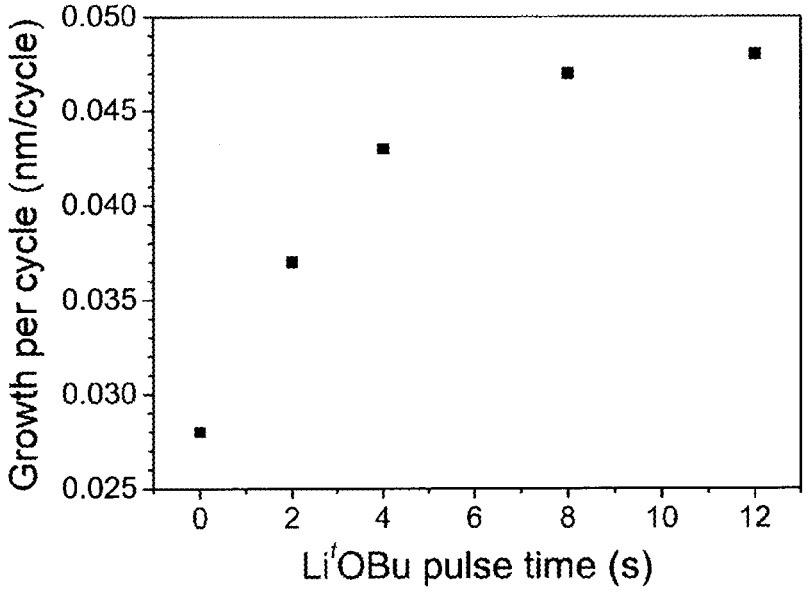

FIG. 4 Average growth per cycle of the LLT films as a function of the Li(t-OBu) pulse time.

EMBODIMENTS OF THE INVENTION

The present invention will hereinafter be described with reference to the enclosed figures, tables and examples. Although specific methods have been provided as examples of embodiments of the invention, it will be clear to a person skilled in the art that variants of the invention are within the scope of the invention.

The present invention discloses a method for the production of lithium-comprising thin film layers by Atomic layer deposition (hereafter ALD) wherein a substrate is to be provided by a thin preferably defect free layer of a lithium comprising compound. The method comprises pulsing of a lithium precursor into a reaction chamber wherein is arranged a substrate which is to be furnished with a lithium comprising layer. If required, an inert purge gas is pulsed through the reaction chamber after each pulse of lithium comprising precursor, or after each sequence of lithium precursor pulses, or even concurrently with the precursor. Alternatively several purge pulses may be performed between each lithium precursor pulse. In some instances purging the chamber may be performed simply by evacuating the chamber. With each lithium precursor pulse cycle, a layer of lithium-containing material will be deposited upon the substrate such that in a layer by layer fashion the lithium-containing material will be deposited upon the substrate surface according to the ALD principle.

The main and surprising effect of the invention is that it has proven possible to deposit a lithium layer on a substrate using ALD in spite of the fact that lithium and other alkali metals are provided with a single ligand in gaseous phase for reaction. It has heretofore been thought that alkali metals would not be suitable for ALD methods as the ligand on the Li-precursor would undergo reactions with the active sites on the surface and form part of a volatile specie and not take part in a self hindering mechanism. In this way the surface would be terminated by Li-atoms who are significantly smaller than their anionic counterparts and easily be adsorbed into the film and not be able to produce a suitable terminating layer to prevent further reactions on the anionic counterparts of the film surface. This has now empirically been proven to be wrong, which is surprising and contravenes a prejudice of the art.

Accordingly the present invention provides a new method for applying a thin film comprising an alkali metal on a surface by use of the ALD technique.

In order for activation of the surface between each deposition cycle it may in an embodiment of the invention be necessary to include introducing an oxygen precursor in the cycle to incorporate oxygen moieties on the surface after each deposition. Any suitable oxygen precursor such as for instance water, $O_3$ or any other oxygen comprising gaseous compound may serve the purpose as will be evident to a person skilled in the art. This oxygen containing precursor is often referred to as the oxidizer in the literature, even though there may be no clear redox reaction taking part in the main formation of the film. The oxygen precursor may be pulsed into the reaction chamber in a manner resembling that of the pulsing of the precursor material. An illustration of the rate of deposition of Li per deposition cycle according to an embodiment of the invention upon a substrate with interceding oxidisation by $O_3$ is given in FIG. 1. The deposition is temperature dependent, with deposition at higher temperatures being less effective than at lower temperatures. Although it is preferable to first pulse the metal phase through the reaction chamber for deposition upon the substrate, it may in some instances be preferable to pulse said oxygen comprising precursor prior to pulsing the metal comprising precursor through the chamber. The precise manner of pulsing may vary, as ALD methods, and variants thereupon, as such are known.

In one embodiment of the present invention the method and obtained thin film are characterised by comprising Li in the form of lithium oxide, as a single oxide or together with one or more other metals or metal oxides forming a metal(s)—Li-oxide thin film or together with carbon forming lithium carbonate. Where the thin film may have a layered structure.

Figure 1:
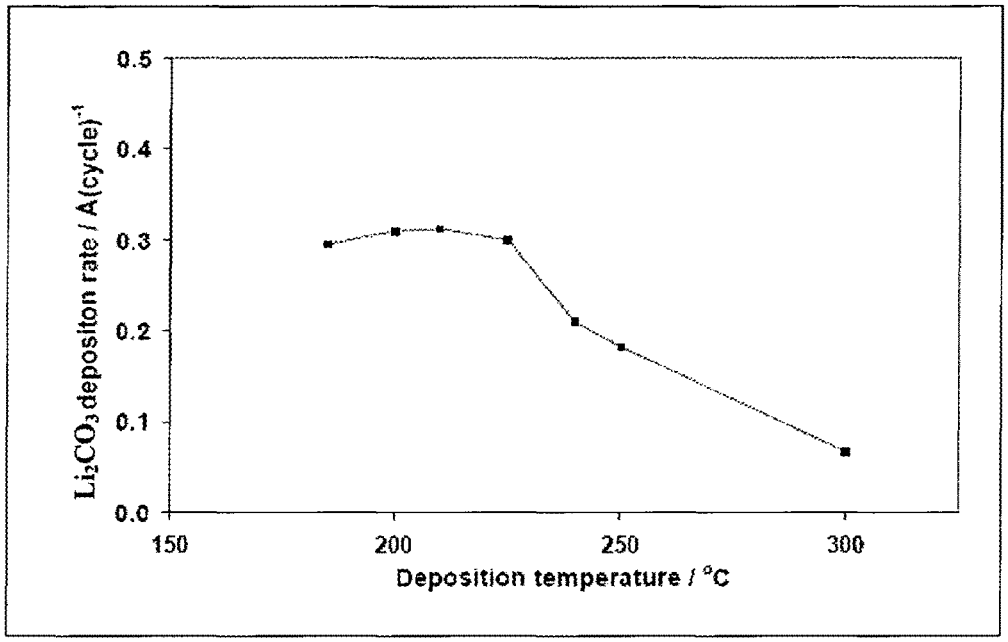
FIG. 1 is a representation of the $Li_2CO_3$ deposition rate as a function of deposition temperature for an embodiment of the invention.

The deposition temperature should be adjusted such that the deposition occurs at the best possible rate, however, as is evident, the temperature must not be too high such that the substrate is damaged, or the precursor decomposes noticeable. FIG. 1 illustrates use of Li(thd) (lithium 2,2,6,6-tetramethylheptane-3,5-dionate) as a lithium precursor. Li(thd) is stable to about 400° C. which thus for this precursor defines the highest possible deposition temperature. Using other precursors, higher or lower deposition temperatures may be envisaged, depending on the physicochemical properties of the precursor and the substrate. Amongst other possible precursors are found organometallic compounds such as lithium alkoxides i.e. Li(t-BuO) (lithium tert-butoxide), alkyls i.e. BuLi (n-butyl lithium), cyclic lithium compounds i.e. LiCp (lithium cyclopentadienyl), lithium dicyclohexylamid, and bimetallic or multimetallic compounds such as (M,Li)R compounds, where M may be another metal from the periodic table, where R may be one or more organic fragments and where both M and Li may be incorporated into the film. The stoichiometry of the M and Li may vary depending on the selection or organic compounds, this last group of precursors may include compounds such as (Ti, Li)-, (La, Li)- and (Ti, La, Li)-organic compounds. This evidently encompasses a large number of possible precursors that may be used, wherein each may be chosen for the specific use on a specific substrate or chosen due to economic, environmental or other considerations. The invention is not limited to a single precursor, and the use of a plurality of different precursors may be envisaged.

A separate consideration concerns the specific pulsing scheme to be used for pertaining to the duration of each pulse and to the pulse sequence. Each pulse sequence may be varied according to need, however the pulse duration of each precursor should be such that the there is sufficient time for the entire substrate surface to have reacted with the precursor. Typical precursor pulse durations may range from about 0.1 to about 20 seconds, preferably from about 0.1 to about 2 second, often about 0.8 seconds. In a similar manner, the purge pulse durations should also be tailored to ensure that the purge has been effective. Typical purge pulse durations may range from about 0.8 to about 3 seconds or longer even up to 6-12 seconds, but often the purge pulse will have a duration of 1-2 seconds. Purge pulse durations may vary significantly depending upon which precursor has been used, and whether the purging pulse occurs after a possible oxidising pulse as described above. The pulse and purge times depends mostly on the fluid dynamics of the deposition system and the chosen temperature of the precursor, i.e. its vapour pressure. A purge of the reaction chamber may be carried out in several different ways. The main importance of the purge is to avoid that there are undesirable gas phase reactions between different types of precursors. A purge may consist of an additional pulse of an inert gas capable of removing excess and unreacted precursors from the previous pulse. A purge may alternatively be carried out by evacuating the chamber by reducing the pressure and in this way remove excess and unreacted precursor from the previous pulse. Alternatively the purge may be effectuated by using the flushing effect of a carrier gas directing the precursor to the substrate and carrying away any by-products. The carrier gas may be used in a pulsevise or continuous manner. Some reactions may occur with a minimum of physisorption of excess precursor to the substrate so that a purging period may be virtually absent. The same considerations with respect to the purging pulse durations are relevant to the duration of the oxidising pulse (oxygen containing precursor), which may range from about 0.1 to about 2 seconds, preferably from about 0.5 to about 1 second, often about 1.2 seconds depending on the oxidiser. As is evident, shorter or longer pulses of each specific compound may prove necessary depending on the surface reaction kinetics as will be evident to a person skilled in the art.

An example of a possible pulsing sequence may thus be:

0.8 s/1.2 s/1.5 s/2.0 s Metal-precursor/purge/oxygen-precursor/purge.

Using these pulses in an embodiment of the invention one achieves a layer composition as described in table as measured by a TOF-ERDA (time of flight elastic recoil detection analysis) method.

TABLE 1

Layer composition in atomic percent for an example of an embodiment of the invention

| Deposition temperature | Li | O | C | H | Na | F |
|---|---|---|---|---|---|---|
| 185° C. | 33 | 49 | 17 | 0.22 | 0.33 | 0.25 |
| 225° C. | 33 | 48 | 18 | 0.2 | 0.21 | 0.29 |

Using Li(thd) as the metal precursor and $O_3$ as the oxidiser this results in the deposition rate as shown in FIG. 1. The pulsing sequence is repeated as many times as is necessary in order to form the desired layer thickness. The layer thickness may be measured by any appropriate method or estimated based on empirical data.

A main purpose of the invention as such is to produce an electrolyte layer suitable for use in lithium battery applications. As such it has been considered advantageous to provide an electrolyte layer comprising further to said lithium layer a lanthanum comprising layer. Thus in an embodiment of the invention, further to the pulses of lithium comprising precursor a lanthanum comprising precursor is pulsed through the reaction chamber for reaction and subsequent deposition upon the substrate.

Lithium as such has long been of major interest in the development of thin film batteries, in particular with respect to its use as an anode, due to its very high energy density of about 3,800 mAh/g and to its very high conductivity. However the reactive nature of Li has necessitated the use of large amounts of excess lithium due to that Li typically reacts with the electrolyte resulting in reaction losses. Previous efforts have been concentrated upon the use of Lipon (lithium phopherous oxynitride) electrolytes, however Li—La-M-O systems, where M is a metal, may present much higher lithium conductivities and would as such prove more effective than the previously studied Lipon electrolytes.

Accordingly an object of the invention is to provide an electrolyte comprising a desired proportion of Li and La compounds using ALD methodology. This will result in a method according to the invention whereby the Li precursor and La precursor will be furnished to the reaction chamber in a predetermined sequence such that the desired composition of the layer is achieved. The specific composition may depend on which use is intended for the electrolyte as will be evident to a person skilled in the art. As for the other compounds to be deposited upon the substrate, the pulse lengths may vary and depend upon the reaction kinetics on the surface. The La precursor pulse duration may typically vary between 0.5 to about two seconds, preferably about 0.8-1.5 seconds. An example of a deposition cycle may thus be:

0.8-1.5 s/1.2 s/1.5 s/2.0 s Li(thd)/purge/oxygen precursor/purge 0.8-1.5 s/1.2 s/1.5 s/2.0 s $La(thd)_3$/purge/oxygen precursor/purge Any suitable La precursor may serve as is evident to a person skilled in the art, in one embodiment of the invention the La precursor is a metal-organic La-compound. In this example use is made of a $La(thd)_3$ precursor.

Figure 2:
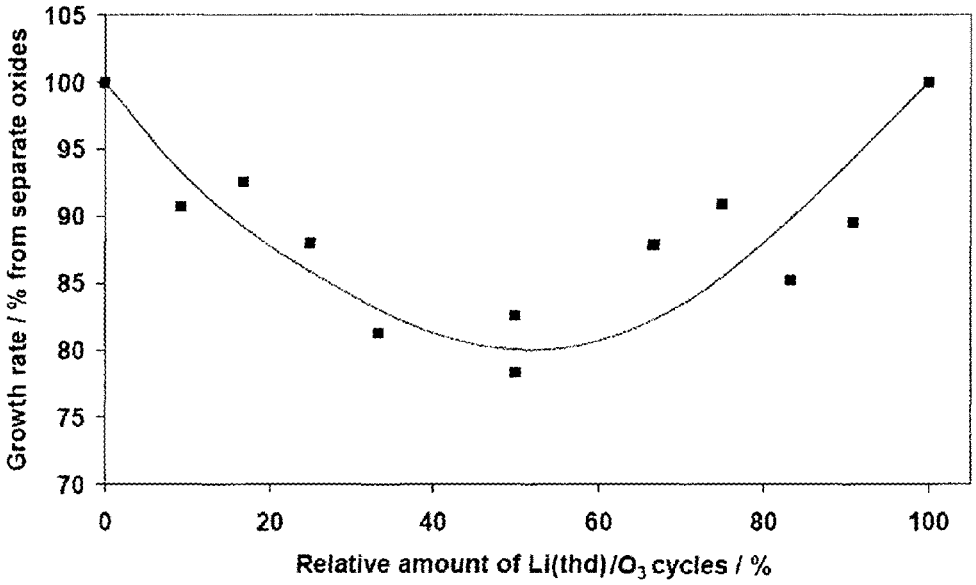
FIG. 2 is a representation of growth rate as a function of pulsing ratio of precursor cycles, compared to the deposition rates of binary processes according to an embodiment of the invention. There is an alternating deposition of Li and La compounds.
Figure 3:
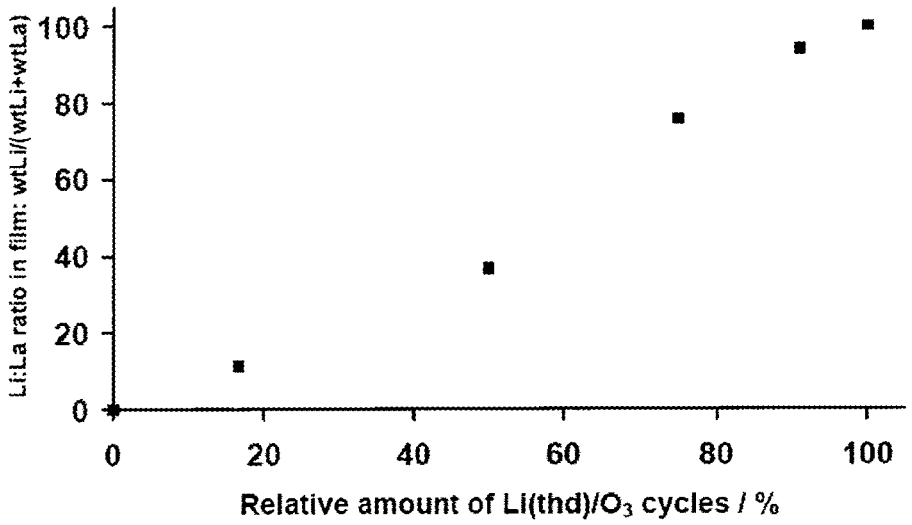
FIG. 3 is a representation of the compositional change of Li—La containing films as a function of pulsing ratio of each of the Li and La precursors according to an embodiment of the invention.

FIG. 2 shows an illustration of the variation of the growth rate of the resulting deposited layer with respect to the percentage of Li(thd)/$O_3$ cycles. FIG. 3 correspondingly illustrates relative amount of Li deposited upon the substrate with respect to the percentage of Li(thd)/$O_3$ cycles.

Using a TOF-ERDA measurement, it has empirically been found that the composition of the layer of each compound varies according to table 2 in this embodiment of the invention.

TABLE 2

Layer composition for an example of an embodiment of the invention

| % Li pulses | La | Li | Li/La ratio | O | C | H | Na | F |
|---|---|---|---|---|---|---|---|---|
| 16.7 | 20 | 3 | 11.1 | 61 | 14 | 1.4 | <0.1 | 0.4 |
| 50 | 15 | 9 | 36.7 | 58 | 17 | 1.5 | 0.1 | 0.25 |
| 75 | 7 | 22 | 75.9 | 54 | 16 | 0.6 | 0.8 | 0.4 |
| 90.9 | 2 | 30 | 94 | 50 | 17.5 | 0.3 | 0.5 | 0.33 |

In one embodiment of the present invention includes further incorporating Ti into the structure thereby obtaining a Li—La—Ti—O layered compound. Ti can be included by a process similar to the La process described above but applying for instance $TiCl_4$ as a precursor and $II_2O$ as oxygen comprising precursor. Applicable Ti precursors include for instance halogenides of Ti, Ti—Li- and Ti-organometallic or metalorganic compounds. An example of a deposition cycle may thus be:

8 s/2 s/2 s/2.0 s Li(t-OBu)/purge/oxygen precursor/purge 2 s/2 s/6 s/3.0 s $La(thd)_3$/purge/oxygen precursor/purge 0.5 s/1 s/2 s/2.0 s $TiCl_4$/purge/oxygen precursor ($H_2O$)/purge This is illustrated in the following example.

Thin films have been deposited using a F-120 Sat (ASM Mirochemistry) reactor by using $La(thd)_3$ (thd=2,2,6,6-tetramethyl-3,5-heptanedione, made in house according to the procedure described in [G. S. Hammond, D. C. Nonhebel, and C.-H. S. Wu, Inorg. Chem., 2 (1963) 73-76]), $TiCl_4$ (>99.0%, Fluka), and Li(t-OBu) (t-OBu=Lithium tert-butoxide) as metal precursors and $H_2O$ (distilled) or ozone as oxygen precursors. The $H_2O$ and $TiCl_4$ precursors were kept at room temperature in containers outside of the reactor during the depositions. The $La(thd)_3$ and Li(t-OBu) was sublimed at 185° C. and 160° C., respectively, and dosed into the reaction chamber using inert gas valves. All films were deposited on single crystalline substrates of Si(111) and soda lime glass substrates at a reactor temperature of 225° C.

Nitrogen was produced in house using a Schmidlin Nitrox 3001 generator (99.999% as to N2+Ar) and used as purging and carrier gas. The pressure of the reactor during growth was maintained at ca. 2 mbar by employing an inert gas flow of 300 $cm^3$ $min^{-1}$. Ozone was produced by feeding 99.999% $O_2$ (AGA) into an OT-020 ozone generator from OzoneTechnology, providing an ozone concentration of 15 vol % according to specifications. An ozone flow of ca. 500 $cm^3$ $min^{-1}$ was used during the ozone pulses.

Thin films in the La—Li—Ti—O system were deposited using an intimate mixture of the cycles used for depositing the different binary oxides. These will be referred to as sub-cycles. The pulse and purge parameters for deposition of the different elements are given in the table 3 below:

TABLE 3

Pulse and purge parameters for an example of an embodiment of the invention

| Element | Pulse/s | Purge/s | $H_2O/O_3$ pulse/s | Purge/s |
|---|---|---|---|---|
| Ti | 0.5 | 1 | 2 ($H_2O$) | 2 |
| La | 2 | 2 | 6 ($O_3$) | 3 |
| Li | 8 | 2 | 2 ($H_2O$) | 2 |

The sub-cycles were combined in different ratios and order to control the stoichiometry of the deposit the Lithium-lanthanum-titanium-oxides (LLT).

The pulsing order of the sub-cycles was shown to have an effect on the film growth, and a self-limiting mechanism was found when pulsing the Li-compound after the La-compound and not after the Ti-compound. ALD type of growth of lanthanum oxide and titanium oxide using $La(thd)_3$+ozone and $TiCl_4$+$H_2O$ has been described in [M. Nieminen, T. Sajavaara, E. Rauhala, M. Putkonen, and L. Niinistö, J. Mater. Chem., 11 (2001) 2340-2345.] and [J. Aarik et al., J. Cryst. Growth 148: 268 (1995), or J. Aarik, A. Aidla, V. Sammelselg, H. Siimon, T. Uustare, J. Cryst. Crowth 169 (1996) 496], respectively. The effect of Li(t-OBu) pulse time on the average growth per cycle of the films grown using a pulsing scheme of sub-cycles as: 400×(1×Ti+3×La+1×Li) is shown in FIG. 4. FIG. 4 depictures the average growth per cycle of the LLT films as a function of the Li(t-OBu) pulse time. The growth rate stabilized at ca. 0.048 nm/cycle for films deposited using at least 8 s pulse of Li(t-OBu).

The composition of the films was analyzed by TOF-ERDA (Time-of-Flight Energy Recoil Detection Analysis) and stabilized at ca. $Li_{0.34}La_{0.30}TiO_{2.9}$ for films deposited with more than 8 s of Li(t-OBu) pulse. In addition to these elements the films contained some chlorine (3.0-3.7 at. %) carbon (1.9-3.0 at. %) and hydrogen (0.7-2.5 at. %) as impurities. Analysis performed by Leila Costelle, Department of Physics, University of Helsinki, Finland.

Equivalent to this process other metal organic, organo metallic, or halogenides may be included in the Li comprising film.

It is thus to a large degree possible to design the electrolyte according to the needs of the task. Amongst possible uses for this electrolyte are as a thin-film barrier between Li layers in a thin-film battery, and it is one of the objects of the present invention to provide such an electrolyte. Although battery technology is one of the possible uses of the present method, it should be clear that other possible uses of the ALD method for depositing Li-layers on a substrate are foreseen. Although exemplified above for use in a battery this will not be the only application for the present invention.

The present invention has thus proposed a method for the formation of thin Li-comprising layers on a substrate using an ALD-method.

While embodiments of the invention have been described, it is understood that various modifications to the disclosed process and its implementation may be made without departing from the scope of the invention as define by the subsequent claims.

The invention claimed is:

1. A method for formation of a Li-comprising layer on a substrate by atomic layer deposition comprising the following steps:

a) providing a substrate in a reaction chamber wherein said reaction chamber is arranged for gas-to-surface reactions, b) pulsing a lithium precursor through said reaction chamber, c) reacting said lithium precursor with at least one surface of said substrate, d) purging of said reaction chamber d1) by sending a purge gas through said reaction chamber for the purging of the reaction chamber or d2) by evacuating said chamber, and repeating steps b) to d) a desired number of times in order for the formation of a thin film layer of a lithium comprising material upon said at least one surface of said substrate, wherein the lithium precursor is selected from among lithium 2,2,6,6-tetramethylheptane-3,5-dionate, lithium alkoxides, lithium alkyls, cyclic lithium compounds, lithium dicyclohexamide, and bimetallic or multimetallic compounds.

2. A method according to claim 1 wherein steps b) through d) are repeated with independently chosen lithium precursors in step b).

3. A method according to claim 1, further comprising the following steps:

e) pulsing an oxygen precursor through said reaction chamber, f) reacting said oxygen precursor with said at least one surface of said substrate, g) purging of said reaction chamber, where the purging of said chamber may be performed by sending a purge gas through said reaction chamber for the purging of the reaction chamber or by evacuating said chamber, repeating steps b) to g) a desired number of times in order for the formation of a thin film layer of a lithium comprising material upon said at least one surface of said substrate.

4. A method for formation of a Li-comprising layer on a substrate by atomic layer deposition comprising the following steps:

a) providing a substrate in a reaction chamber wherein said reaction chamber is arranged for gas-to-surface reactions, b) pulsing a lanthanum precursor through said reaction chamber, c) reacting said lanthanum precursor with said at least one surface of said substrate, d) purging of said reaction chamber, e) pulsing an oxygen precursor through said reaction chamber, f) reacting said oxygen precursor with said at least one surface of said substrate, g) purging of said reaction chamber, h) pulsing a lithium precursor through said reaction chamber, i) reacting said lithium precursor with a surface layer of the substrate, j) purging of said reaction chamber, k) pulsing an oxygen precursor through said reaction chamber, l) reacting said oxygen precursor with said at least one surface of said substrate, m) purging of said reaction chamber, n) repeating steps b) to m) a desired number of times in order for the formation of a thin film layer of a lithium and lanthanum comprising material upon said at least one surface of said substrate, where the purging of said chamber may be performed by sending a purge gas through said reaction chamber for the purging of the reaction chamber or by evacuating said chamber.

5. A method for formation of a Li-comprising layer on a substrate by atomic layer deposition comprising the following steps:

a) providing a substrate in a reaction chamber wherein said reaction chamber is arranged for gas-to-surface reactions, b) pulsing a lanthanum precursor through said reaction chamber, c) reacting said lanthanum precursor with said at least one surface of said substrate, d) purging of said reaction chamber, e) pulsing an oxygen precursor through said reaction chamber, f) reacting said oxygen precursor with said at least one surface of said substrate, g) purging of said reaction chamber, h) pulsing a lithium precursor through said reaction chamber, i) reacting said lithium precursor with a surface layer of the substrate, j) purging of said reaction chamber, k) pulsing an oxygen precursor through said reaction chamber, l) reacting said oxygen precursor with said at least one surface of said substrate, m) purging of said reaction chamber, n) pulsing a titanium precursor through said reaction chamber, o) reacting said titanium precursor with said at least one surface of said substrate, p) purging of said reaction chamber, q) pulsing an oxygen precursor through said reaction chamber, r) reacting said oxygen precursor with said at least one surface of said substrate, s) purging of said reaction chamber, t) repeating steps b) to s) a desired number of times in order for the formation of a thin film layer of a lithium, lanthanum and titanium comprising material upon said at least one surface of said substrate, where the purging of said chamber may be performed by sending a purge gas through said reaction chamber for the purging of the reaction chamber or by evacuating said chamber.

6. A method according to claim 1, wherein each step of the process is independently repeated a desired number of times.

7. A method according to claim 3, where the steps b)-g) are independently repeated one or more times before continuing the sequence.

8. A method according to claim 1, where the thin film layer is an oxide or a carbonate layer or a mixture thereof.

9. A method according to claim 5 for the production of a La—Li—Ti—O layered thin film.

10. A method according to claim 1 for the production of a lithium-comprising thin film battery.

11. A method according to claim 1 for the production of a lithium-comprising electrolyte thin film for use in a battery.

12. A method according to claim 4, wherein the lithium precursor is selected from among lithium 2,2,6,6-tetramethylheptane-3,5-dionate, lithium alkoxides, lithium alkyls, cyclic lithium compounds, lithium dicyclohexamide, and bimetallic or multimetallic compounds.

13. A method according to claim 12, wherein each step of the process is independently repeated a desired number of times.

14. A method according to claim 12, where the groups of steps b)-g) and f)-m) respectively are independently repeated one or more times before continuing the sequence.

15. A method according to claim 12, where the thin film layer is an oxide or a carbonate layer or a mixture thereof.

16. A method according to claim 12 for the production of a lithium-comprising thin film battery.

17. A method according to claim 12 for the production of a lithium-comprising electrolyte thin film for use in a battery.

18. A method according to claim 5, wherein the lithium precursor is selected from among lithium 2,2,6,6-tetramethylheptane-3,5-dionate, lithium alkoxides, lithium alkyls, cyclic lithium compounds, lithium dicyclohexamide, and bimetallic or multimetallic compounds.

19. A method according to claim 18, wherein each step of the process is independently repeated a desired number of times.

20. A method according to claim 18, where the groups of steps b)-g), f)-m) and n)-s) respectively are independently repeated one or more times before continuing the sequence.

21. A method according to claim 18, where the thin film layer is an oxide or a carbonate layer or a mixture thereof.

22. A method according to claim 18 for the production of a lithium-comprising thin film battery.

23. A method according to claim 18 for the production of a lithium-comprising electrolyte thin film for use in a battery.

*24. A method for formation of a Li-comprising layer on a substrate by atomic layer deposition comprising the following steps:*

*a) pulsing a lithium precursor through a reaction chamber having a substrate disposed therein and arranged for gas-to-surface reactions,*

*b) reacting said lithium precursor with a surface of said substrate,*

*c) removing excess or unreacted lithium precursor from said substrate, and*

*repeating steps a) to c) a desired number of times in order for the formation of a thin film layer of a lithium comprising material upon said surface of said substrate,*

*wherein the lithium precursor is selected from among lithium 2,2,6,6-tetramethylheptane-3,5-dionate, lithium alkoxides, lithium alkyls, cyclic lithium compounds, lithium dicyclohexamide, and bimetallic or multimetallic compounds.*

* * * * *